United States Patent
Eun

(10) Patent No.: US 6,753,684 B2
(45) Date of Patent: Jun. 22, 2004

(54) INSPECTION APPARATUS AND METHOD ADAPTED TO A SCANNING TECHNIQUE EMPLOYING A ROLLING WIRE PROBE

(75) Inventor: Tak Eun, Ansan-shi (KR)

(73) Assignee: MicroInspection, Inc., Kyunggi-do (KR)

(*) Notice: Subject to any disclaimer, the term of this patent is extended or adjusted under 35 U.S.C. 154(b) by 63 days.

(21) Appl. No.: 10/030,370
(22) PCT Filed: Feb. 6, 2001
(86) PCT No.: PCT/KR01/00171
§ 371 (c)(1), (2), (4) Date: Apr. 29, 2002
(87) PCT Pub. No.: WO01/57545
PCT Pub. Date: Aug. 9, 2001

(65) Prior Publication Data

US 2003/0006757 A1 Jan. 9, 2003

(30) Foreign Application Priority Data

Feb. 7, 2000 (KR) .......................................... 2000/5662

(51) Int. Cl.[7] .......................... G01R 31/08; G01R 31/02
(52) U.S. Cl. ...................................... 324/515; 324/714
(58) Field of Search ................................ 324/515, 513, 324/517, 525, 754, 762, 761, 758

(56) References Cited

U.S. PATENT DOCUMENTS

| 3,915,850 A | * | 10/1975 | Crownover .................. 209/560 |
| 5,596,283 A | * | 1/1997 | Mellitz et al. .............. 324/754 |
| 6,040,705 A | * | 3/2000 | Garcia et al. ................ 324/762 |
| 6,160,409 A | * | 12/2000 | Nurioka ...................... 324/754 |

FOREIGN PATENT DOCUMENTS

| DE | 3441426 | 8/1985 |
| JP | 61218914 | 4/1986 |
| JP | 4029070 | 1/1992 |

* cited by examiner

Primary Examiner—Albert Decady
Assistant Examiner—James C. Kerveros
(74) Attorney, Agent, or Firm—Seyfarth Shaw LLP

(57) ABSTRACT

An inspection apparatus and method of electrode patterns using rolling wire probes, which includes a rolling wire rotating for performing a rolling contact sliplessly across the electrode patterns, and a control unit for controlling operations of the inspection apparatus wholly and for discriminating the electrical characteristics according to the electrical signal sensed through the rolling wire provided to the rolling wire probe. The inspection method is used flexibly with electrode patterns having various forms regardless of the change of model or design of the product, unlike the inspection method of the conventional art by the test pin block. Upon inspecting a pixel portion of the electrode pattern, a scratch is not generated by the rolling contact operation, thereby increasing yield of the finished goods.

10 Claims, 7 Drawing Sheets

INSPECTION APPARATUS AND METHOD ADAPTED TO A SCANNING TECHNIQUE EMPLOYING A ROLLING WIRE PROBE

BACKGROUND OF THE INVENTION

1. Field of the Invention

The present invention relates to an apparatus and method for inspecting electrical characteristics, such as open/short, with regard to the electrode patterns formed on a panel type product such as a PDP(Plasma Display Panel).

2. Description of the Background Art

Generally, a glass panel, for example, a PDP, as shown in FIGS. 1a and 1b, comprises a front panel 10 and a rear panel 11. A large number of electrode patterns 10a and 11a are formed on the surfaces of the front and rear panels 10 and 11.

In a 42 inch PDP, a line width and a pitch of one among electrode patterns 10a and 10b are 50 µm and 30 µm, respectively, whereas since a line length is 1 m long following cases that the line is cut, an open state, or connected with an adjacent line, a short state, are frequently occurred not only in a process for forming an electrode pattern and but also in a manufacturing process such as a heating process being repeated thereafter. Accordingly, an inspection process that whether the formed electrode pattern become opened/shorted or not, in the middle of the manufacturing process, is requisite for increase of yield of the PDP manufacturing processes.

As mentioned above, as shown in FIG. 2, a test pin block 12 is used in order to inspect electrical characteristics of the electrode patterns 10a and 11a in a conventional art. When inspecting by using the test pin, a large number of pins 12a formed at the test pin block 12 are contacted to connector connection portions, that is, both ends 10b and 10c of the electrode pattern 10a or both ends 11b and 11c of the electrode pattern 11a and thereafter a continuity test is performed between an inspection object electrode pattern and an adjacent pattern, and then electrical characteristics of the corresponding pattern, that is, the existence of open or short, is inspected.

However, the above inspection method has several disadvantages as follows.

First, the test pin block 12 of FIG. 3 is expendables with a high price and has no durability and so it becomes a factor for raising the cost price of goods. That is, an inspection by the test pin block 12 is a pressure contact type and so the test pin is damaged easily.

Second, in a case that a model or a design of goods is changed, since a position and a pitch etc. of the electrode pattern is changed, the conventional test pin block 12 and the related mechanical parts all must be replaced. Accordingly, since there is no flexibility against the change of the model or the design of goods, the conventional inspection method cannot be used in flexible manner.

Third, in a case that the electrode patterns are formed in those ways as shown in FIGS. 1a and 1b, since, when inspecting, the pin 12a of the test pin block 12 must be contacted to pixel portions "A" and "B" besides a connector connection portion of a PDP pattern, there is a disadvantage that an another defective factor is generated by scratching according to the contact.

Fourth, in a case that flatness of a glass panel on which electrode patterns are formed is not good, since the pin 12a of the test pin block 12 can exactly be contacted to the electrode patterns, the whole of the glass panel must be fixed by a separate accurate large vacuum chuck and an accurate servo mechanism of x-y-θ of three axis is required in order to set an accurate x-y positioning of the electrode patterns and resultantly these become factors to raise the cost in manufacturing.

SUMMARY OF THE INVENTION

Accordingly, it is a first object of the present invention to provide an inspection apparatus and method adapted to a scanning technique employing a rolling wire probe, in order to solve the above problems, in which it can be used flexibly up to electrode patterns having various forms and a factor generating scratch become reduced and a burden of the cost rising in manufacturing become decreased.

It is a second object of the present invention to provide an inspection apparatus and method adapted to a scanning technique employing a rolling wire probe in which an accuracy of inspection can be enhanced and expandable parts can be replaced efficiently.

In order to achieve the above-described object of one aspect of the present invention, in an inspection of electrical characteristics of the plural number of electrode patterns formed on a panel, the apparatus comprises a rolling wire probe having a rolling wire rotating at a constant speed in order to be performed a rolling contact sliplessly across the electrode patterns; a control unit for controlling operations of the inspection apparatus wholly and discriminating the electrical characteristics according to the electrical signal sensed through the rolling wire provided to the rolling wire probe.

BRIEF DESCRIPTION OF THE DRAWINGS

The present invention will become better understood with reference to the accompanying drawings, which are given only by way of illustration and thus are not limitative of the present invention, wherein.

DETAILED DESCRIPTION OF THE PREFERRED EMBODIMENTS

An inspection apparatus and method adapted to a scanning technique employing a rolling wire probe in accordance with a preferred embodiment of the present invention will now be described with reference to the accompanying drawings.

Figure 1A:
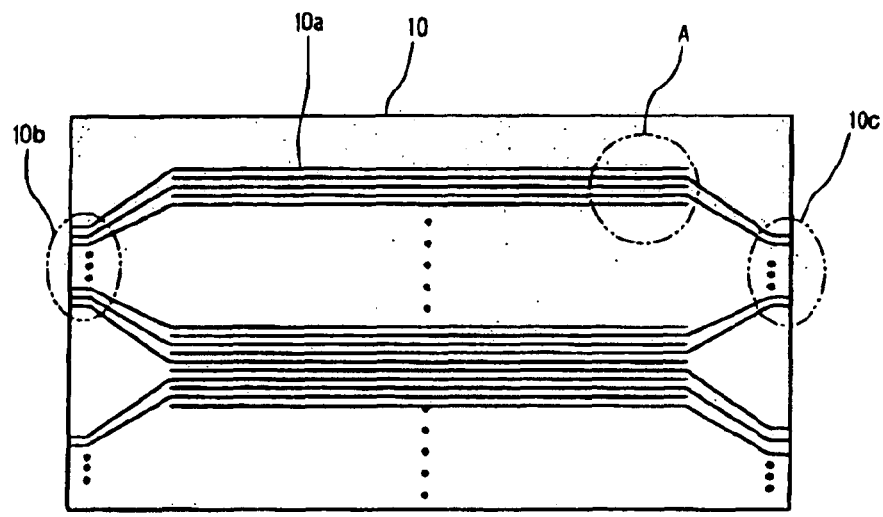
FIGS. 1a and 1b are views illustrating electrode patterns formed on a general PDP.
Figure 1B:
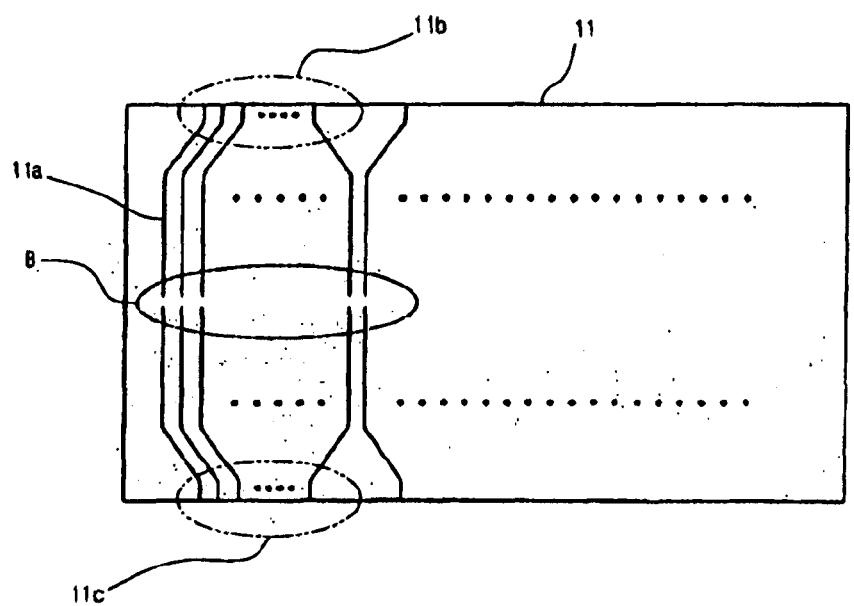
Figure 2:
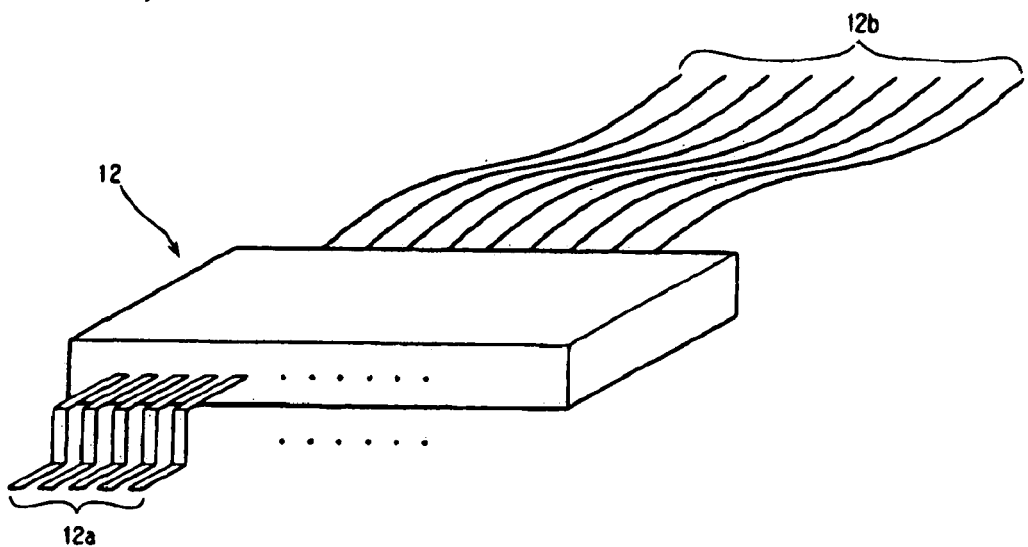
FIG. 2 is a view illustrating a conventional test pin block for inspecting electrical characteristics of electrode patterns.
Figure 3:
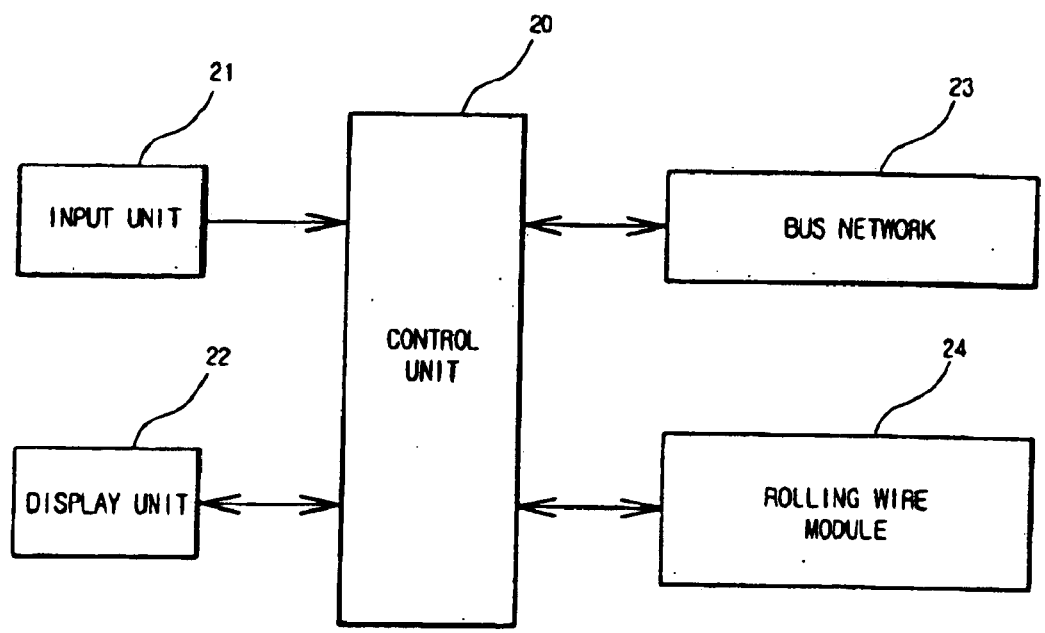
FIG. 3 is a block diagram illustrating a construction of a whole system in accordance with the present invention.

Referring to FIG. 3, the whole system of the present invention comprises a control unit 20 for controlling the whole operations of an inspection apparatus, an input unit 21 composed of a touch panel or a keyboard or a mouse etc. for inputting commands to the control unit 20, a display unit 22 for displaying a operation state of the inspection apparatus according to the control of the control unit 20, a bus network 23 for providing an interface between the control unit 20 and an external device, and a rolling wire module 24 for performing a rolling contact of a wire on an electrode pattern according to the control of the control unit 20, so scanning the electrode pattern and providing the scanned information.

The rolling wire module 24 includes a rolling wire probe being rolling contacted to the electrode pattern by rotating in order to synchronize with the scan speed, a small servo motor for making the rolling wire rotate, an encoder for sensing the rotation speed of the motor, a loading/unloading actuator, and an aerostatic pad 127.

Figure 4A:
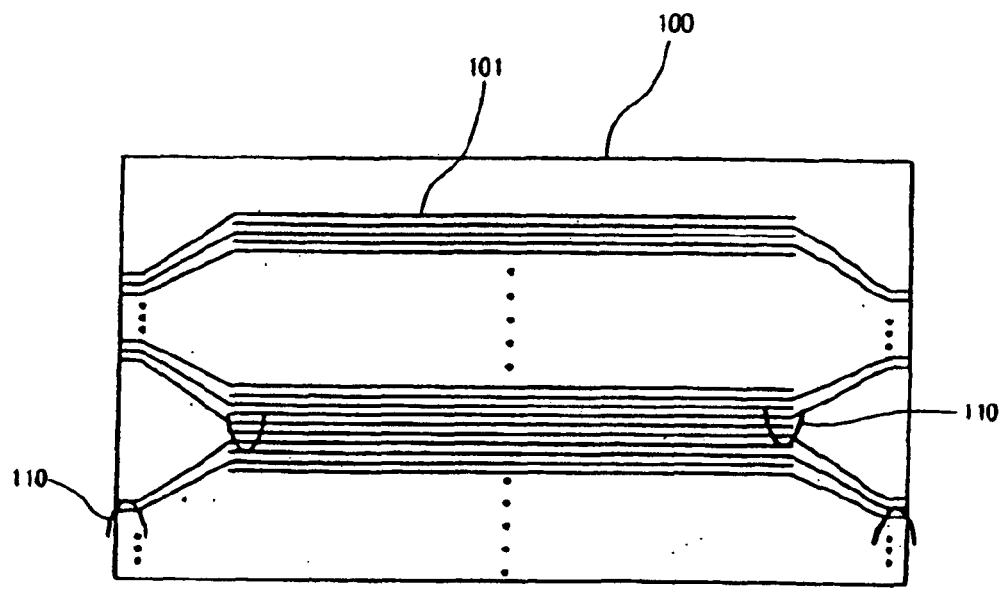
FIGS. 4a and 4b are views illustrating arrangements of a rolling wire probe in accordance with the present invention.
Figure 4B:
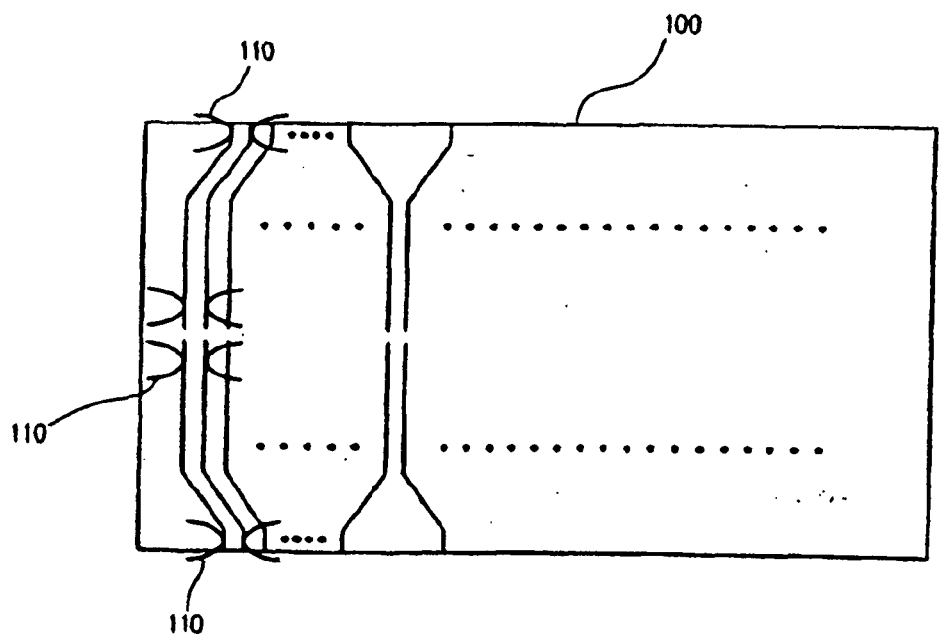

Referring to FIGS. 4a and 4b, at least two rolling wire probes 110 can be used to connector connection portions. As shown in FIG. 4a, in a case of a front panel, four rolling wire probes 110 can be used, that is, two rolling wire probes are used to the left/right sides of the panel 100, respectively. And, as shown in FIG. 4b, in a case of a rear panel, eight rolling wire probes 110 can be used, that is, two rolling wire probes are used to the left/right sides of the panel 100 and a position divided an electrode pattern 100 of the center portion of the panel 100. Besides, the rolling wire probe apparatus of the present invention may use by combining a proximity sensor apparatus of an electrostatic capacity type, which is filed separately.

Figure 5A:
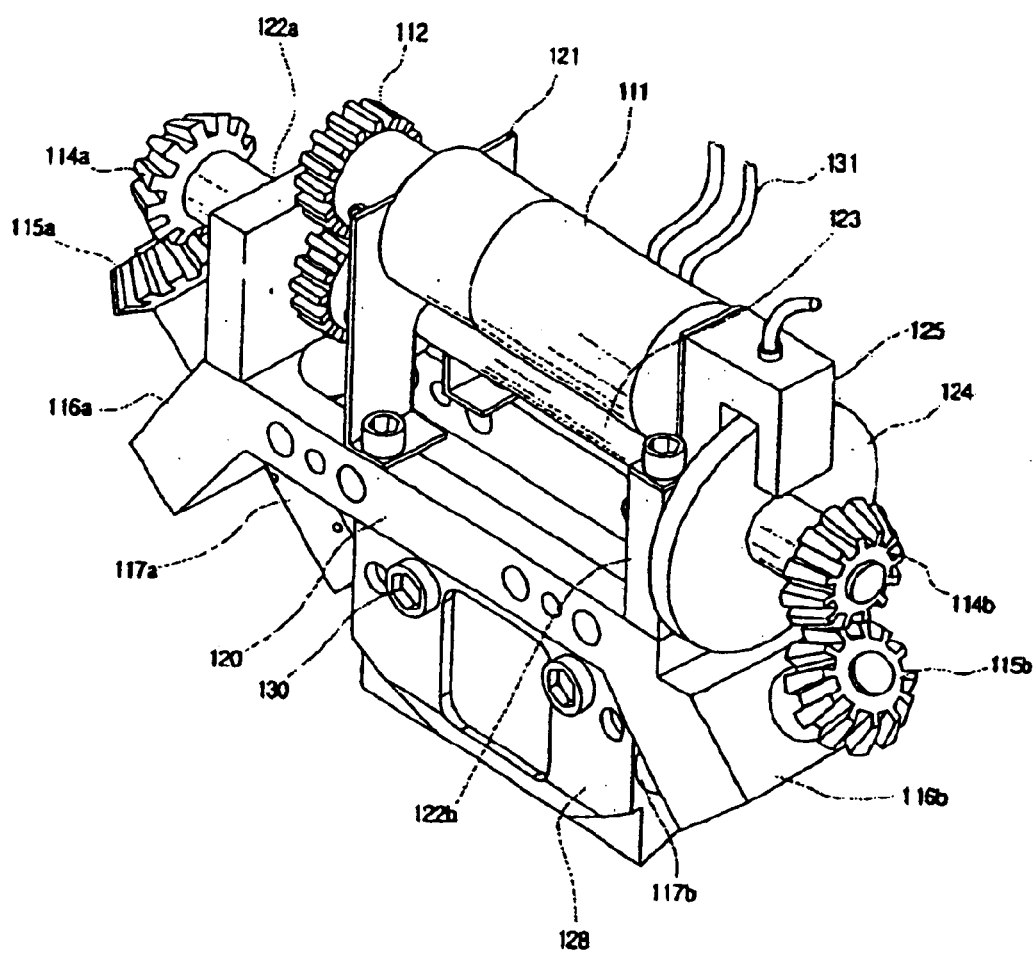
FIG. 5a is a perspective view of a rolling wire probe in accordance with the present invention.
Figure 5B:
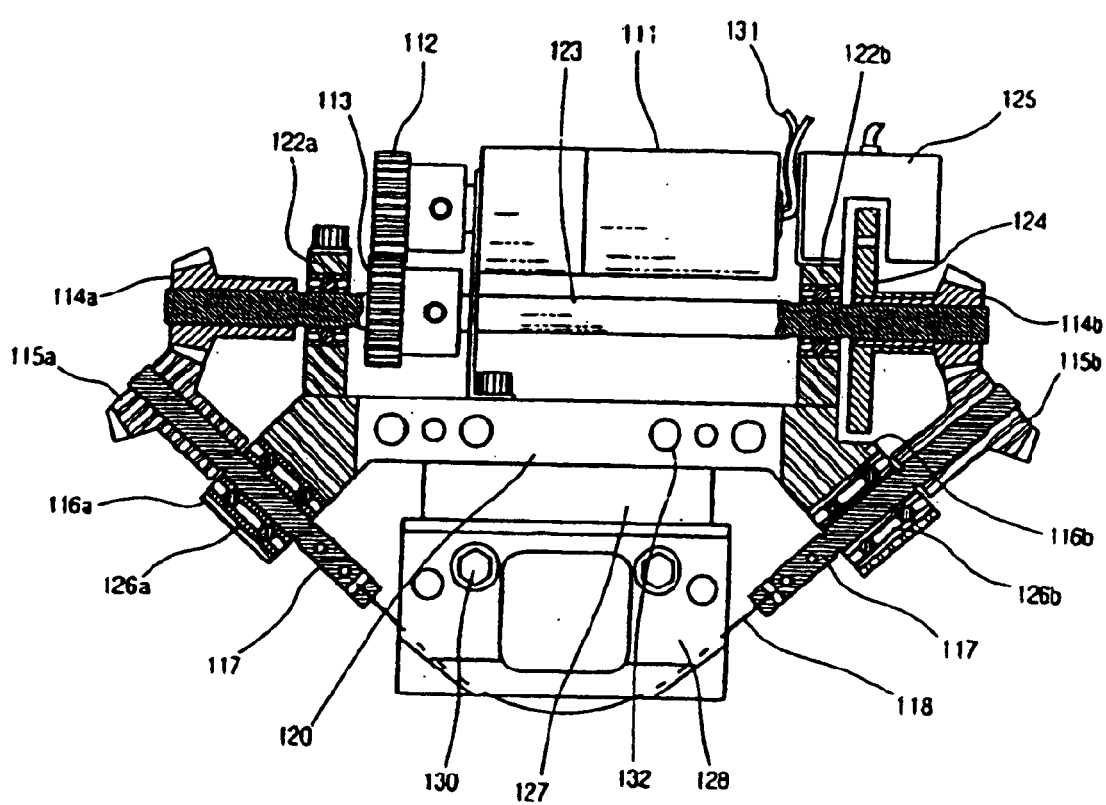
FIG. 5b is a cross-section view of a rolling wire probe in accordance with the present invention.

In the rolling wire probe 100 apparatus, as shown in FIG. 5, a servo motor 111 is driven by the control of the control unit 20 and fixed to a supporting body 120 by a bracket 121. A first gear 112 is connected and rotated by the servo motor 111 and is connected with a second gear 113 of a rotating shaft 123, which is supported to two shaft supporting members 122a and 122b fixed to the supporting body 120 and rotated. First bevel gears 114a and 114b are mounted to ends of left and right of the rotation shaft 123, respectively, and a disk 124 for detecting a rotation speed is separately mounted to an inside of the right end of the first bevel gear 114b and the disk 124 is engaged with a photo sensor 125.

On the other hand, bearing shaft supporting members 126a and 126b are mounted to inclined supporting units 116a and 116b, which are protruded corresponding to both ends of the supporting body 120. Second bevel gears 115a and 115b are connected to upper portions of the bearing shaft supporting members 126a and 126b, respectively, and engaged with the first bevel gears 114a and 114b supported to the rotation shaft 123. Two wire fixing members 117 corresponded to each other are mounted to the bearing shaft supporting members 126a and 126b in order to be connected and rotated to the second bevel gears 115a and 115b.

And, the body of the aerostatic pad 127 is mounted to a lower portion of the supporting body 120. A wire 118 is guided on a metal electrode plate 128 which is attached to a front surface of the body of the aerostatic pad body 127 and fixed to the wire fixing members 117a and 117b.

Here, the servo motor 111, the wire 118 and the photo sensor 125 are electrically connected with the control unit 20.

Reference numerals 130,131 and 132 depict an electrode terminal, an electric wire and a fixing hole.

As above-constructed, in the rolling wire probe apparatus of the present invention, according to the rotation of the servo motor 111, the rotation shaft 123 is rotated by the second gear 113 engaged with the first gear 112. The first bevel gears 114a and 114b mounted to the rotation shaft 123 and the second bevel gears 115a and 115b engaged with the first bevel gears 114a and 114b are connected and rotated. The wire fixing members 117a and 117b rotated with the second bevel gears 115a and 115b at the same axis are also rotated, so that the wire fixed to the center axis of the wire fixing members is exactly interlocked and rotated. At this time, according to the rotation speed of the servo motor 111, a circumference speed of the outside diameter of the wire 118 is determined, the circumference speed and the line speed that the rolling wire probe 110 scans the electrode patterns 101 are tuned by the control unit 20, a rolling contact can only perform between the electrode patterns 101 and the wire 118 without slipping relatively.

An inspection method of the electrical characteristics, that is, open and shorts states of the electrode patterns 101 through the above apparatus will be described in detail with reference to an embodiment as follows.

Referring to FIG. 4, the rolling wire probe 110 and four rolling wire probes, which are constructed identically, respectively, can be used. First and third rolling wire probes scan on one side of the electrode pattern 101 and second and fourth rolling wire probes scan on the other side of the electrode pattern 101. At this time, the first and third rolling wire probes scan adjacent electrode patterns, similarly, the second and fourth rolling wire probes also scan adjacent electrode patterns. A scan speed of the first to fourth rolling wire probes is previously controlled identically.

When performing the above scan operation, the control unit 20, for example, applies an electrical signal to the rolling wire provided to the first rolling wire probe and thereafter detects an electrical signal being transmitted to the second rolling wire probe through the electrode pattern. When the corresponding electrode pattern is not opened, an applied signal is transmitted from the second rolling wire probe as it is, otherwise the applied signal is not transmitted. According to this, an open state of the corresponding electrode pattern can be sensed and if the applied signal is all detected at the second and fourth rolling wire probes, adjacent electrode patterns are short each other and therefore a short state of the electrode pattern can also be sensed.

In addition, in the scan method of the present invention, it is the liberty of choice that anyone among the inspection apparatus and the electrode patterns make fix or move. According to the present invention, since a contact type inspection without damage of the electrode pattern can be performed, in a case of inspecting a pixel portion of the electrode pattern, a scratch is not generated by the rolling contact operation. Also, since the inspection method uses a scan type, it can be corresponded to various electrode patterns and the inspection apparatus is unnecessary to replace separately according to the design change and so that it can be used very flexibly.

Figure 6A:
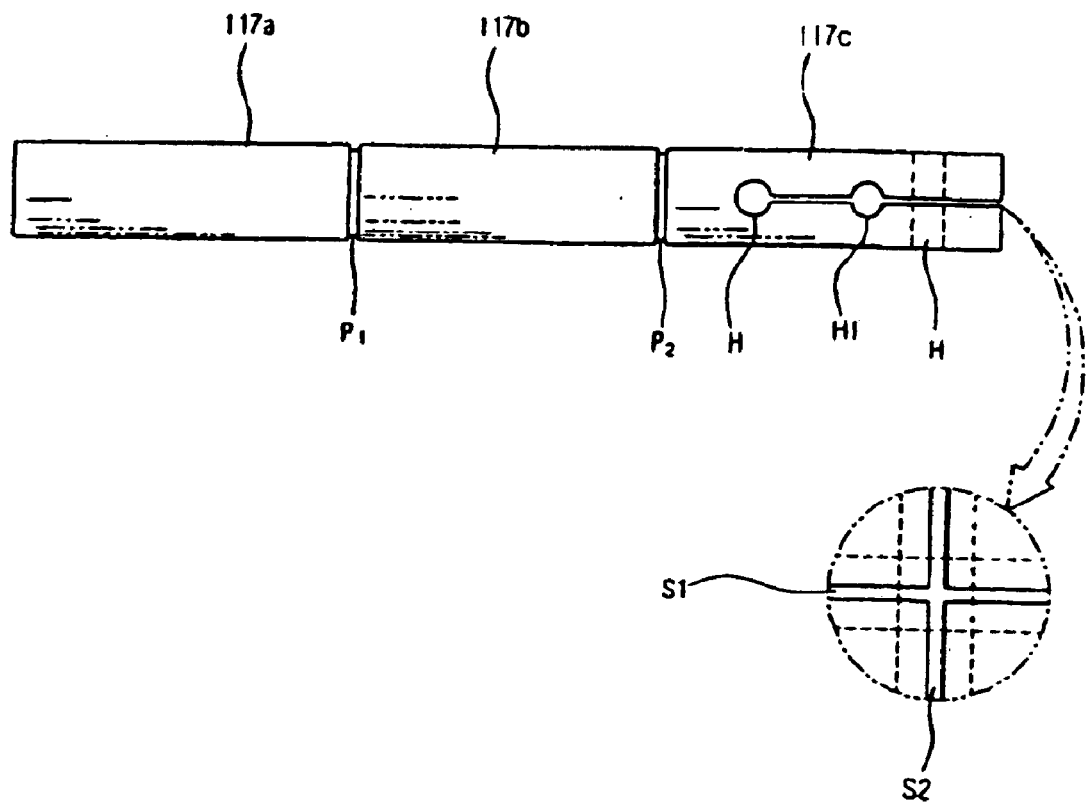
FIGS. 6a and 6b are views illustrating a structure of a wire fixing member and an exclusive tool for assembling and disassembling the wire of the wire fixing member in accordance with the present invention.
Figure 6B:
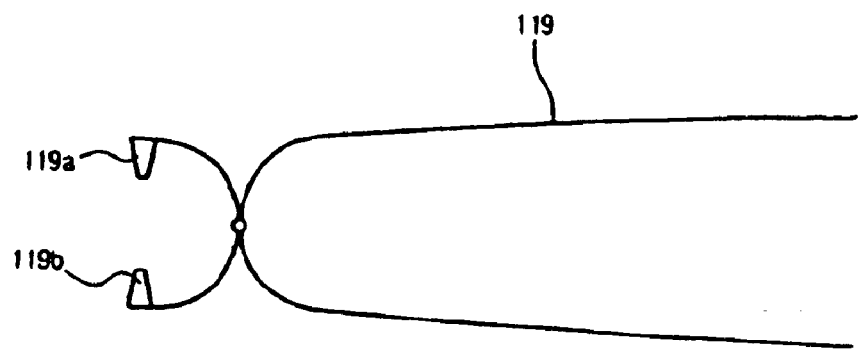

And, the wire used in the present invention can obtain the accuracy of inspection only when the accurate rotation operation can be performed. In the wire used in the present invention, it has a fine diameter of 0.2 mm below corresponding to a pitch of an electrode pattern and so there is a problem that it is very difficult to fix the wire to the center axis of a wire fixing member. According to the present, the above problem is solved as follows. That is, as explained in FIG. 6 in detail, the wire fixing member comprises a connection unit 117a, a mounting unit 117b and a fixing unit 117c, which are divided three parts by two recesses P1 and P2 with a circular form formed along a circumference surface at the middle portion of the wire fixing member. The fixing unit 117c has a long slit S1 and a short slit S2. The slits S1 and S2 have a width of small size, which are smaller than a diameter of the wire 118, and made toward the inside of shaft direction at the center of the open end. Also, the slits S1 and S2 are crossed with an cross form at the center of the cross-section of the wire fixing member 117c. A hole H of a cylinder type, which is larger than a width of the slits and penetrated toward a diameter direction, is formed at the ends of the slits Si and S2, respectively. A hole H1, which is also penetrated toward the diameter direction, is formed at the middle portion of the long slit S1 to be used to widen the slit S1. As above-constructed, in the wire fixing member, the mounting unit 117b is inserted into the bearing shaft support members 126a and 126b of the rolling wire probe and thereafter snap rings (not shown) are mounted to the recesses P1 and P2 and therefore the rolling wire probe 110 is assembled and fixed to the inclined supporting units 116a and 116b. At this time, the connection unit 117a is connected and fixed to the second bevel gears 115a and 115b. Also, when fixing the wire to the wire fixing member, an exclusive tool 119 is used. The device 119 is a type of nippers wholly and upper and lower taper pins 119a and 119b are opposite to the ends of the nippers, being corresponded with each other. A diameter of free ends of the taper pins 119a and 119b is smaller than that of the hole H1 and its diameter is gradually bigger toward the body of nippers and the diameter is bigger than that of the hole H1 at the fixing member.

Accordingly, taper pins 119a and 119b are inserted into the upper and lower entrances of the hole H1 penetrated to the long slit and pressed by holding the exclusive tool 119, and then the taper pins 119a and 119b are inserted gradually to the hole H1 of the long slit S1, so that the long slit is widened and therefore the wire 118 can be easily inserted into the wire fixing member 117. After inserting, when the taper pin of the exclusive tool is removed from the hole H1, the long slit is restored to the previous shape and the wire is exactly fixed to a position crossed to the slit, that is, a center of shaft and therefore when rotating them, the degree of accuracy can be obtained owing to their concentricity.

The hole H of a cylinder type formed at the ends of the slits S1 and S2 reduces the concentrated stress of the slit ends, in a case that the slits are widened when inserting the wire. Accordingly, when replacing and mounting repeatedly the expendables, it is reasonable mechanically.

Figure 7:
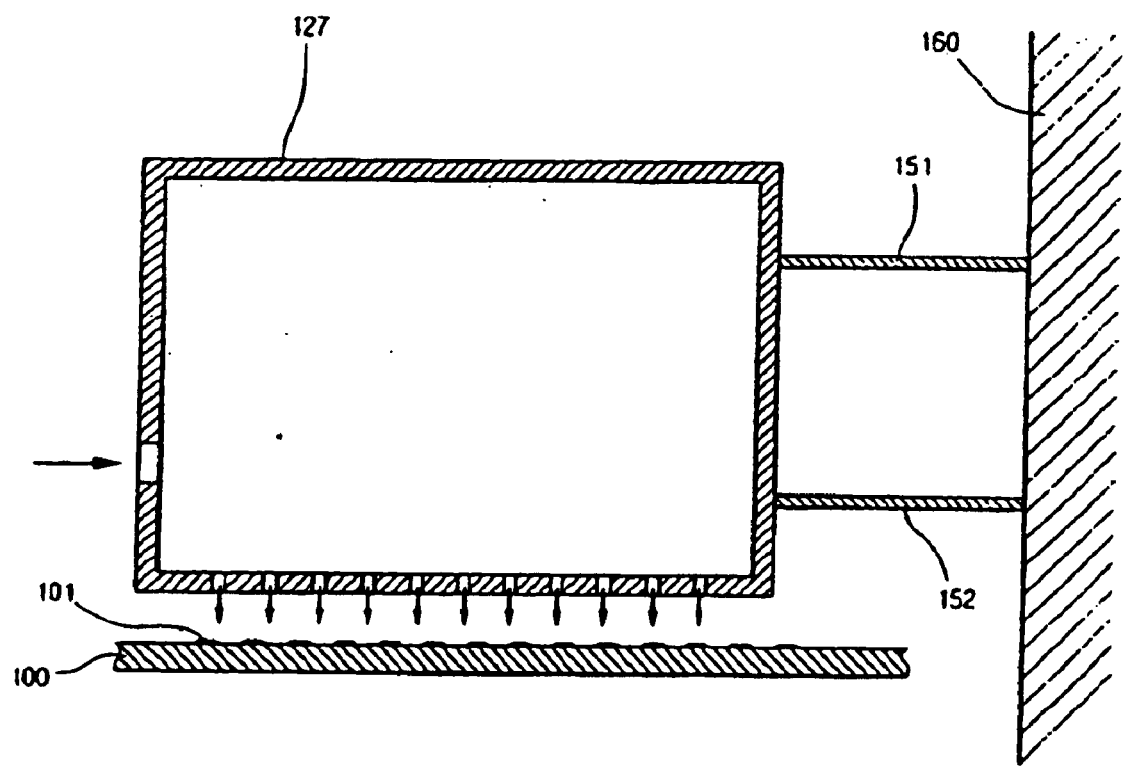
FIG. 7 is a view of mechanism being floated the rolling wire probe by an aerostatic pad in accordance with the present invention.

On the other hand, as shown in FIG. 7, the rolling wire probe 110 can be used together with the aerostatic pad 150.

Generally, since the glass panel 100 can be twisted in a process of custody or through several processes such as a process for depositing a dielectric layer in a furnace, in the conventional art, an inspection has been performed after fixing the glass panel by a large vacuum chuck, however, such an apparatus is expensive and so it become a factor to raise the cost of product. Accordingly, in the present invention, the aerostatic pad 127 having an air nozzle 127a is mounted to a bottom, and an inspection surface of the glass panel 100 and the body of the rolling wire probe 100 are floated to maintain a constant distance each other. Therefore, although the glass panel is curved, the degree of accuracy of inspection is maintained. That is, the apparatus of rolling wire probe 110 is connected to a supporting member 160 by plate springs 151 and 152 interposed between them in order to be paralleled to the surface of inspection and so it can be moved freely toward up and down, that is, in the gravitational direction. The wire for sensing an electrical signal is guided on the metal electrode plate 128, and positioned by considering the floating conditions previously designed. That is, the position is a lower than that of the lower surface of the aerostatic pad 127 and therefore, although the inspection surface is curved, in a state that the rolling wire 118 is floated with a constant distance, the wire is rolling contacted efficiently and can scan the inspection surface.

As described above, the present invention inspects electrical characteristics of electrode patterns formed on the panel type product such as a PDP by a scanning method through the rolling wire probe. According to the present invention, there is an advantage that the inspection method can be used flexibly up to electrode patterns having various forms regardless of the change of model or design of the product, unlike the inspection method of the conventional art by the test pin block.

There is also an advantage, in the present invention, that when inspecting a scratch also does not generated in the pixel portion, thereby increasing yield of the finished goods.

There are also advantages, in the present invention, that the rolling wire, as an electrical signal sensing member, that is, as core expendables, not only can be mounted and replaced easily and but also can be used together with the aerostatic pad, resultantly, the manufacturing cost can be reduced and the degree of accuracy of the inspection can be enhanced.

There is also an advantage, in the present invention, that the inspection apparatus of the present invention can be used together with an capacitive proximity sensor probe apparatus and a panel transfer guide apparatus, which are filed separately respectively, and so the more effective inspection can be performed.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. In an inspection of electrical characteristics of electrode patterns formed on a panel, an inspection apparatus of the electrode patterns using a rolling wire comprising:

rolling wire probes, at least one more, having a rolling wire rotating in order to perform a rolling contact sliplessly across the electrode patterns;

a control unit for controlling operations of the inspection apparatus wholly and discriminating the electrical characteristics according to the electrical signal sensed through the rolling wire provided to the rolling wire probe; and an aerostatic pad for making the rolling wire probe float with a constant clearance from the electrode patterns.

2. The inspection apparatus of electrode patterns according to claim 1, wherein the apparatus further comprises a disk for sensing a rotation speed, which rotates by connecting to a rotation shaft of the servo motor, and a photo sensor for sensing a rotation speed of the disk.

3. The inspection apparatus of electrode patterns according to claim 1, wherein the rolling wire probe comprises:

a servo metro, which is driven by the control unit;

a series of power transfer apparatus, which is connected to a rotation shaft of the servo motor and rotated;

two wire fixing members which is connected to the power transfer apparatus and rotated; a rolling wire which is connected between the center axis of the two wire fixing members and fixed; a metal electrode plate for guiding, supporting and electrically contacting the rolling wire.

4. The inspection apparatus of electrode patterns according to claim 3, wherein the apparatus further comprises a disk for sensing a rotation speed, which rotates by connecting to a rotation shaft of the servo motor, and a photo sensor for sensing a rotation speed of the disk.

5. The inspection apparatus of electrode patterns according to claim 3, wherein the apparatus further comprises an aerostatic pad for making the rolling wire probe float with a constant clearance from the electrode patterns.

6. The inspection apparatus of electrode patterns according to claim 5, wherein the apparatus comprises a disk for sensing a rotation speed, which rotates by connecting to a rotation shaft of the servo motor, and a photo sensor for sensing a rotation speed of the disk.

7. The inspection apparatus of electrode patterns according to claim 3, wherein the wire fixing members have two slits, which are formed that one is long and other is short toward a shaft direction of the wire fixing member, crossed each other at the center of cross-section of the wire fixing member, a penetration hole formed respectively to the ends of the slits, and a separate penetration hole formed in the middle of the long slit.

8. The inspection apparatus of electrode patterns according to claim 7, wherein the inspection apparatus further comprises an exclusive tool in which a taper pin is formed on its end in order to open the slits by inserting the taper pin into the penetration hole.

9. An inspection method of scanning type using a rolling wire comprising the steps of:

performing sequentially a rolling contact operation to the plurality of electrode patterns by using first and second rolling wire probes having rolling wires rotating with a constant speed, and scanning the plurality of electrode pattern;

applying an electrical signal from a side of the electrode pattern to the wire provided to the first rolling wire probe;

comparing the electrical signal transmitted through the electrode pattern to the rolling wire provided to the second rolling wire probe at the other side of the electrode pattern; and discriminating a state of continuity of the electrode pattern;

wherein a rotation speed of the rolling wire is sensed and compared with a scan speed across the electrode patterns, and synchronized by the control unit.

10. The inspection method of scanning type using a rolling wire according to claim 9, wherein adjacent electrode patterns to the electrode scanned by the first and second rolling wire probes are scanned by the third and fourth rolling wire probes, and when the electrical signal applied through the first and third rolling wire probes is not transmitted to the second and fourth rolling wire probes, it is discriminated that the corresponding electrode pattern is open, whereas when the electrical signal applied through anyone among the first and third rolling wire probes is transmitted to the second and fourth rolling wire probes with sameness, it is discriminated that the corresponding electrode pattern is short.

* * * * *

UNITED STATES PATENT AND TRADEMARK OFFICE
CERTIFICATE OF CORRECTION

PATENT NO. : 6,753,684 B2
DATED : June 22, 2004
INVENTOR(S) : Eun

It is certified that error appears in the above-identified patent and that said Letters Patent is hereby corrected as shown below:

Column 6,
Line 59, "metro" should be -- motor --.

Column 8,
Line 18, after "electrode" insert -- pattern being --.

Signed and Sealed this

Ninth Day of November, 2004

JON W. DUDAS
*Director of the United States Patent and Trademark Office*